US012785435B2

(12) United States Patent
Kanai et al.

(10) Patent No.: US 12,785,435 B2

(45) Date of Patent: Nov. 3, 2026

(54) CHARGING METHOD, DIAGNOSIS METHOD, CHARGER, AND DIAGNOSIS SYSTEM OF BATTERY, AND NON-TRANSITORY STORAGE MEDIUM

(71) Applicant: KABUSHIKI KAISHA TOSHIBA, Tokyo (JP)

(72) Inventors: Yuta Kanai, Yokohama (JP); Ryosuke Yagi, Yokohama (JP); Wataru Uno, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 924 days.

(21) Appl. No.: 18/166,607

(22) Filed: Feb. 9, 2023

(65) Prior Publication Data

US 2024/0006905 A1 Jan. 4, 2024

(30) Foreign Application Priority Data

Jul. 1, 2022 (JP) ................................. 2022-107120

(51) Int. Cl.
*H02J 7/90* (2026.01)
*G01R 31/389* (2019.01)
(Continued)

(52) U.S. Cl.
CPC ............ *H02J 7/933* (2026.01); *G01R 31/389* (2019.01); *G01R 31/392* (2019.01); *H02J 7/84* (2026.01);
(Continued)

(58) Field of Classification Search
CPC ........ H02J 7/00712; H02J 7/005; H02J 7/933; H02J 7/84; G01R 31/389; G01R 31/392
(Continued)

(56) References Cited

U.S. PATENT DOCUMENTS 4,947,124 A * 8/1990 Hauser .............. H02J 7/007182 324/426
5,367,244 A * 11/1994 Rose ................. H02J 7/007184 320/141
(Continued)

FOREIGN PATENT DOCUMENTS

CN 112152276 A 12/2020
CN 112731179 A 4/2021
(Continued)

OTHER PUBLICATIONS

EPO machine translation of JP-2012141202-A (Year: 2012).*
Office Action issued on Dec. 2, 2025, in corresponding Japanese Application No. 2022-107120, 11 pages.

*Primary Examiner* — John T Trischler
(74) *Attorney, Agent, or Firm* — Maier & Maier, PLLC

(57) ABSTRACT

In a charging method of a battery, at each of a first time point and a second time point after a time point at which a predetermined time is elapsed from the first time point, a superimposed current obtained by superimposing a current waveform that periodically changes at a predetermined frequency on a charging current is input to the battery, thereby measuring, concerning an impedance of the battery at the predetermined frequency, a first impedance at the first time point and a second impedance at the second time point. In the charging method, using a parameter representing an increase state of the second impedance to the first impedance as an index, a current value of the charging current is adjusted.

12 Claims, 6 Drawing Sheets

(51) Int. Cl.

| | |
|---|---|
| ***G01R 31/392*** | (2019.01) |
| ***H02J 7/84*** | (2026.01) |
| *G01R 31/36* | (2020.01) |
| *G01R 31/367* | (2019.01) |
| *G01R 31/396* | (2019.01) |
| *H01M 10/42* | (2006.01) |
| *H01M 10/48* | (2006.01) |
| *H02J 7/80* | (2026.01) |

(52) U.S. Cl.
CPC ........ *G01R 31/3648* (2013.01); *G01R 31/367* (2019.01); *G01R 31/396* (2019.01); *H01M 2010/4271* (2013.01); *H01M 10/48* (2013.01); *H02J 7/80* (2026.01)

(58) Field of Classification Search
USPC .................................. 320/51, 107, FOR. 150
See application file for complete search history.

(56) References Cited

U.S. PATENT DOCUMENTS 5,633,576 A * 5/1997 Rose ................. H02J 7/007184 320/160
6,008,624 A * 12/1999 Bergstrom ................ H02J 7/02 320/128
6,479,967 B2 * 11/2002 Berlureau ............ G01R 31/389 320/135
6,747,457 B2 * 6/2004 Suzuki .................... B60L 58/10 324/433
6,778,913 B2 * 8/2004 Tinnemeyer ......... G01R 31/389 702/30
6,876,174 B1 * 4/2005 Samittier Marti ... G01R 31/389 320/132
8,148,939 B2 * 4/2012 Kitagawa .............. H01M 10/46 320/112
8,203,314 B2 * 6/2012 Odaohhara ....... H02J 7/007194 320/128
8,305,045 B2 * 11/2012 Maeagawa ........ H02J 7/007182 320/141
8,378,687 B2 * 2/2013 Yoneda ................ G01R 31/367 324/430
8,521,497 B2 * 8/2013 Gering ................. G01R 31/392 703/13
8,847,551 B2 * 9/2014 Coe ....................... H01M 10/44 320/124
8,866,444 B2 * 10/2014 Stewart ............. H01M 10/0525 320/134
9,043,176 B2 * 5/2015 Tanaka ................. G01R 31/392 702/63
9,207,286 B2 * 12/2015 Matsui ................. G01R 31/392
9,209,637 B2 * 12/2015 Monden ................ H01M 10/44
9,239,363 B2 * 1/2016 Matsui .................... B60L 58/15
9,246,337 B2 * 1/2016 Iwasawa ............... H02J 7/0016
9,246,344 B2 * 1/2016 Suzuki .................. H01M 10/44
9,252,626 B2 * 2/2016 Coe ...................... H02J 7/00711
9,322,884 B2 * 4/2016 Luo ...................... G01R 31/389
9,506,990 B2 * 11/2016 Stewart ................. H02J 7/0025
9,673,657 B2 * 6/2017 van Lammeren ... H02J 7/00712
10,008,873 B2 * 6/2018 Zeier ......................... H02J 7/02
10,023,064 B2 * 7/2018 Lee ........................... H02J 7/00
10,023,067 B2 * 7/2018 Delobel .................. B60L 53/62
10,379,168 B2 * 8/2019 Christophersen .... G01R 31/392
10,534,028 B2 * 1/2020 Stewart ................. H02J 7/0029
10,534,038 B2 1/2020 Tanaka et al.
10,605,871 B2 * 3/2020 Matsuno .............. G01R 31/389
10,857,895 B2 * 12/2020 Oh ........................ H01M 10/44
10,901,044 B2 * 1/2021 Christophersen .... G01R 31/389
11,009,556 B2 * 5/2021 Soejima ............... G01R 31/392
11,031,788 B2 * 6/2021 Park ...................... H01M 10/48
11,280,844 B2 * 3/2022 Hoermaier ......... G01R 31/3835
11,327,119 B2 5/2022 Pressas et al.
11,402,433 B2 * 8/2022 Naha .................... G01R 31/392
11,428,745 B2 * 8/2022 Haga ..................... H02J 7/0013
11,600,868 B2 * 3/2023 Miura ................... H01M 10/48
11,637,330 B2 * 4/2023 Oh .......................... B60L 53/00 320/152
11,650,262 B2 * 5/2023 Yagi ..................... G01R 31/389 324/430
11,662,389 B2 * 5/2023 Gullapalli ............ G01R 31/374 324/430
11,719,755 B2 * 8/2023 Pressas .............. G01R 31/3842 324/430
11,824,172 B2 * 11/2023 Miura ................... H01M 10/48
11,999,258 B2 * 6/2024 Zhang .................. G01R 31/389
12,000,902 B2 * 6/2024 Morrison ............. G01R 31/389
12,085,626 B2 * 9/2024 Lee ...................... G01R 31/396
12,203,997 B2 * 1/2025 Gullapalli ............ G01R 31/367
12,210,066 B2 * 1/2025 Ryu ..................... G01R 31/392
12,216,169 B2 * 2/2025 Gray .................... G01R 31/367
12,294,234 B2 * 5/2025 Schulz ................ H01M 10/613
12,313,689 B2 * 5/2025 Uno ................... G01R 31/3842
12,326,475 B2 * 6/2025 Hong .................... H01M 10/44
12,372,587 B2 * 7/2025 Lee .................... G01R 31/3842
12,392,842 B2 * 8/2025 Lee ......................... H02J 7/005
12,431,728 B2 * 9/2025 Konopka ............. H02J 7/00711
2002/0130635 A1 * 9/2002 Berlureau ............ G01R 31/367 320/118
2003/0030414 A1 * 2/2003 Suzuki .................. H01M 10/48 324/427
2003/0204328 A1 * 10/2003 Tinnemeyer ......... G01R 31/389 702/30
2007/0170895 A1 * 7/2007 Dardik ............. H02J 7/007184 320/150
2009/0039833 A1 * 2/2009 Kitagawa .............. H01M 10/48 320/134
2009/0085527 A1 * 4/2009 Odaohhara ....... H02J 7/007194 320/150
2009/0096459 A1 * 4/2009 Yoneda ................ G01R 31/367 324/430
2010/0201320 A1 * 8/2010 Coe ....................... H02J 7/0069 320/136
2011/0181249 A1 * 7/2011 Deguchi ............... H02J 7/0013 320/149
2011/0298417 A1 * 12/2011 Stewart ................. H02J 7/0029 320/132
2011/0301931 A1 * 12/2011 Gering ................. G01R 31/392 703/13
2012/0007556 A1 * 1/2012 Matsui .................... B60L 58/18 320/112
2012/0086406 A1 * 4/2012 Maeagawa ........ H02J 7/007182 320/162
2013/0030736 A1 * 1/2013 Tanaka ................. G01R 31/392 702/63
2013/0088201 A1 * 4/2013 Iwasawa .............. G01R 31/392 320/118
2013/0253862 A1 * 9/2013 Luo ........................ G01R 27/02 702/65
2013/0335034 A1 * 12/2013 Suzuki ............. H01M 10/0525 320/160
2014/0103934 A1 * 4/2014 Matsui .................. B60L 3/0046 324/427
2014/0287287 A1 * 9/2014 Osaka ................. H01M 10/613 324/430
2014/0358462 A1 * 12/2014 Christophersen .... G01R 31/392 702/65
2014/0375270 A1 * 12/2014 Coe ....................... H02J 7/0069 320/112
2015/0039255 A1 * 2/2015 Stewart ................. H02J 7/0029 702/63
2015/0162771 A1 6/2015 Monden et al.
2015/0253204 A1 * 9/2015 Hebiguchi .......... H01M 10/486 324/430
2015/0276889 A1 * 10/2015 Osaka .................. G01R 31/389 324/430
2015/0288213 A1 * 10/2015 van Lammeren ... H01M 10/486 320/153
2016/0131719 A1 * 5/2016 Takahashi ............ G01R 31/389 324/430
2016/0268841 A1 * 9/2016 Zeier ......................... H02J 7/02

(56) References Cited

U.S. PATENT DOCUMENTS

| | | | | |
|---|---|---|---|---|
| 2017/0074918 | A1* | 3/2017 | Stewart | H02J 7/0029 |
| 2017/0259684 | A1* | 9/2017 | Lee | B60L 53/665 |
| 2018/0126863 | A1* | 5/2018 | Delobel | B60L 53/62 |
| 2018/0183254 | A1* | 6/2018 | Park | H02J 7/007182 |
| 2018/0210037 | A1 | 7/2018 | Ataka | |
| 2018/0321326 | A1* | 11/2018 | Tanaka | G01R 31/3842 |
| 2019/0064282 | A1* | 2/2019 | Haga | H01M 10/42 |
| 2019/0064284 | A1* | 2/2019 | Christophersen | G01R 31/389 |
| 2019/0079140 | A1* | 3/2019 | Matsuno | H02J 7/14 |
| 2019/0202299 | A1 | 7/2019 | Oh et al. | |
| 2019/0293723 | A1* | 9/2019 | Pressas | H02J 7/04 |
| 2019/0341784 | A1* | 11/2019 | Lee | G01R 31/389 |
| 2019/0393564 | A1* | 12/2019 | Miura | H01M 4/133 |
| 2020/0072909 | A1* | 3/2020 | Soejima | G01R 31/392 |
| 2020/0256924 | A1* | 8/2020 | Hoermaier | G01R 31/389 |
| 2021/0053450 | A1* | 2/2021 | Oh | H02J 7/00714 |
| 2021/0063490 | A1* | 3/2021 | Naha | G01R 31/367 |
| 2022/0026496 | A1* | 1/2022 | Gullapalli | H01M 10/486 |
| 2022/0029443 | A1* | 1/2022 | Konopka | H02J 7/0047 |
| 2022/0190619 | A1* | 6/2022 | Fasching | H02J 7/875 |
| 2022/0190622 | A1 | 6/2022 | Kobayashi | |
| 2022/0206076 | A1 | 6/2022 | Morrison | |
| 2022/0221521 | A1* | 7/2022 | Pressas | G01R 31/3842 |
| 2022/0326310 | A1* | 10/2022 | Hong | G06F 1/28 |
| 2022/0381845 | A1* | 12/2022 | Yagi | G01R 31/392 |
| 2023/0008384 | A1* | 1/2023 | Zhang | G01R 31/3835 |
| 2023/0135040 | A1* | 5/2023 | Schulz | H01M 10/613<br>320/125 |
| 2023/0163373 | A1* | 5/2023 | Miura | H01M 10/049<br>29/593 |
| 2023/0168308 | A1* | 6/2023 | Ryu | G01R 31/392 |
| 2023/0208169 | A1* | 6/2023 | Liang | G01R 31/392<br>320/107 |
| 2023/0231403 | A1* | 7/2023 | Feng | H02J 7/005<br>320/162 |
| 2023/0366939 | A1* | 11/2023 | Uno | G01R 31/3842 |
| 2023/0375627 | A1* | 11/2023 | Gullapalli | G01K 13/00 |
| 2023/0384393 | A1* | 11/2023 | Lee | G01R 31/392 |
| 2023/0400526 | A1* | 12/2023 | Kanai | G01R 31/392 |
| 2023/0417837 | A1* | 12/2023 | Lee | B60L 58/16 |
| 2024/0012060 | A1* | 1/2024 | Uno | G01R 31/392 |
| 2024/0027540 | A1* | 1/2024 | Lee | G01R 31/392 |
| 2024/0142530 | A1* | 5/2024 | Anurag | G01R 31/3842 |
| 2024/0183907 | A1* | 6/2024 | Gray | G01R 31/367 |
| 2024/0393406 | A1* | 11/2024 | Lee | G01R 31/371 |
| 2024/0426929 | A1* | 12/2024 | Mitsuoka | H01M 10/4257 |
| 2025/0058668 | A1* | 2/2025 | Mo | B60L 53/62 |
| 2025/0192205 | A1* | 6/2025 | Fukaya | H01M 8/04679 |
| 2025/0355053 | A1* | 11/2025 | Uemura | G01R 27/08 |

FOREIGN PATENT DOCUMENTS

| | | | | |
|---|---|---|---|---|
| CN | 114172218 | A | | 3/2022 |
| CN | 114285103 | A | | 4/2022 |
| JP | 2012141202 | A | * | 7/2012 |
| JP | 2017106889 | A | | 6/2017 |
| JP | 2019530189 | A | | 10/2019 |
| JP | 2020034426 | A | | 3/2020 |
| JP | 2021077570 | A | | 5/2021 |
| JP | 2022085385 | A | | 6/2022 |
| WO | 2021045172 | A1 | | 3/2021 |

* cited by examiner

CHARGING METHOD, DIAGNOSIS METHOD, CHARGER, AND DIAGNOSIS SYSTEM OF BATTERY, AND NON-TRANSITORY STORAGE MEDIUM

CROSS-REFERENCE TO RELATED APPLICATIONS

This application is based upon and claims the benefit of priority from Japanese Patent Application No. 2022-107120, filed Jul. 1, 2022; the entire contents of which are incorporated herein by reference.

FIELD

Embodiments described herein relate generally to a charging method, a diagnosis method, a charger, and a diagnosis system of a battery, and a non-transitory storage medium.

BACKGROUND

In recent years, concerning a battery such as a secondary battery, the frequency characteristic of the impedance of the battery is measured, and the state of the battery including the degradation state of the battery is diagnosed based on the measurement result of the frequency characteristic of the impedance. In such a diagnosis, a current waveform such as the current waveform of an AC current, whose current value periodically changes, is input to the battery at each of a plurality of frequencies, and the impedance of the battery is measured at each of the plurality of frequencies, thereby measuring the frequency characteristic of the impedance of the battery. When measuring the frequency characteristic of the impedance of the battery in the above-described way, it is required to measure the impedance of the battery concurrently with charging of the battery. For this reason, a superimposed current obtained by superimposing a periodically changing current waveform (the current waveform of an AC current) on a charging current is input to the battery, thereby measuring the impedance of the battery.

Concerning a battery such as a lithium ion secondary battery, when measuring the impedance of the battery by inputting a superimposed current to the battery, as described above, if the charging rate of the charging current is higher than an appropriate range, lithium is hardly diffused in at least one of the positive electrode and the negative electrode, and uneven distribution of lithium readily occurs in at least one of the positive electrode and the negative electrode. Hence, if the impedance of the battery is measured using the above-described superimposed current in a state in which charging is being performed at a charging rate higher than the appropriate range, the measurement result of the impedance of the battery is affected not only by the degradation of the battery including the degradation of an electrode active material but also the uneven distribution of lithium in at least one of the positive electrode and the negative electrode. On the other hand, if the charging rate of the charging current is lower than the appropriate range in a state in which the impedance is being measured using the superimposed current, the charging time of the battery becomes long. Hence, when measuring the impedance of the battery concurrently with charging of the battery, the current value of the charging current is required to be adjusted to an appropriate magnitude.

DETAILED DESCRIPTION

Figure 1:
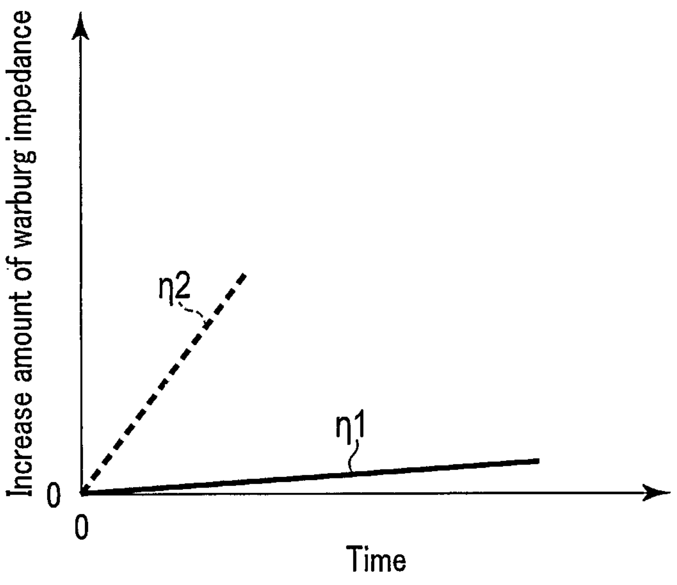
FIG. 1 is a schematic view showing, concerning a battery as a diagnosis target in the embodiment, an example of the relationship between a charging rate and the Warburg impedance of the battery.

In a charging method of a battery according to the embodiment, at each of a first time point and a second time point after a time point at which a predetermined time is elapsed from the first time point, a superimposed current obtained by superimposing a current waveform that periodically changes at a predetermined frequency on a charging current is input to the battery, thereby measuring, concerning the impedance of the battery at the predetermined frequency, a first impedance at the first time point and a second impedance at the second time point. In the charging method, using a parameter representing an increase state of the second impedance to the first impedance as an index, the current value of the charging current is adjusted.

The embodiment will be described below with reference to the accompanying drawings.

A battery that is a charging target and a diagnosis target in the embodiment will be described first. The battery as the diagnosis target and the charging target is, for example, a secondary battery such as a lithium ion secondary battery. The battery may be formed by a unit cell (unit battery), or may be a battery module or a cell block formed by electrically connecting a plurality of unit cells. When the battery is formed by a plurality of unit cells, the plurality of unit cells may electrically be connected in series, or may electrically be connected in parallel in the battery. In addition, both a series-connection structure in which a plurality of unit cells are connected in series and a parallel-connection structure in which a plurality of unit cells are connected in parallel may be formed in the battery. Furthermore, the battery may be any one of a battery string, a battery array, and a storage battery, in each of which a plurality of battery modules are electrically connected. Also, in a battery module in which a plurality of unit cells are electrically connected, each of the plurality of unit cells may be a battery as a diagnosis target and a charging target.

In the battery as described above, the electric charge amount (charging amount) and the SOC are defined as parameters representing the charging state of the battery. The electric charge amount of the battery in real time is calculated based on the electric charge amount of the battery at a predetermined time point and a time change from the predetermined time point concerning a current flowing to the battery. For example, the time integrated value of the current flowing to the battery from the predetermined time point is added to the electric charge amount of the battery at the predetermined time point, thereby calculating the electric charge amount of the battery in real time.

In the battery, for the voltage, a lower limit voltage Vmin and an upper limit voltage Vmax are defined. Also, an SOC value is defined as the value of an SOC of the battery. In the battery, a state in which the voltage in discharging or charging under a predetermined condition becomes the lower limit voltage Vmin is defined as a state in which the SOC value is 0 (0%), and a state in which the voltage in discharging or charging under a predetermined condition becomes the upper limit voltage Vmax is defined as a state in which the SOC value is 1 (100%). Additionally, in the battery, a charging capacity (charging electric charge amount) until the SOC value changes from 0 to 1 in charging under a predetermined condition or a discharging capacity (discharging electric charge amount) until the SOC value changes from 1 to 0 in discharging under a predetermined condition is defined as a battery capacity. The ratio of a remaining electric charge amount (remaining capacity) until the state in which the SOC value is 0 to the battery capacity of the battery is the SOC of the battery.

The battery includes a positive electrode and a negative electrode as electrodes, and the polarities of the positive electrode and the negative electrode are opposite to each other. As electrode active materials, the positive electrode contains a positive electrode active material, and the negative electrode contains a negative electrode active material. In an example, the battery as the diagnosis target is a lithium ion secondary battery that is charged and discharged as lithium ions move between the positive electrode and the negative electrode. In this case, the positive electrode includes, as the positive electrode active material, one of lithium nickel cobalt manganese oxide, lithium cobalt oxide, lithium nickel cobalt aluminum oxide, lithium iron phosphate, and lithium manganese oxide, and the negative electrode includes, as the negative electrode active material, one of lithium titanate, titanium oxide, niobium titanium oxide, and a carbon-based active material.

In a battery as described above such as a lithium ion secondary battery, if charging such as high-speed charging is performed at a high charging rate, lithium is hardly diffused and uneven distribution of lithium readily occurs in at least one of the positive electrode and the negative electrode. That is, if the battery is charged at a high charging rate, the concentration of lithium tends to be uneven in at least one of the positive electrode and the negative electrode. For example, in a battery using a carbon-based active material as the negative electrode active material, uneven distribution of lithium tends to readily occur in at least the negative electrode at the time of charging at a high charging rate. Also, in a battery using lithium titanate as the negative electrode active material, uneven distribution of lithium tends to readily occur in at least the positive electrode at the time of charging at a high charging rate.

In addition, the impedance components of the battery include not only an ohmic resistance including a resistance in the moving process of lithium in an electrolyte, the charge transfer impedance of each of the positive electrode and the negative electrode, an impedance derived from a coat formed on the positive electrode or the negative electrode by a reaction or the like, and the inductance component of the battery but also the Warburg impedance of each of the positive electrode and the negative electrode, which is an impedance in the diffusion process of ions such as lithium ions in the electrode active material of each of the positive electrode and the negative electrode. In each of the positive electrode and the negative electrode, the Warburg impedance is large in a state in which uneven distribution of lithium occurs, as described above, as compared to a state in which lithium is not unevenly distributed.

FIG. 1 is a schematic view showing, concerning a battery as a diagnosis target in the embodiment, an example of the relationship between a charging rate and the Warburg impedance of the battery. In FIG. 1, the abscissa represents time based on the start of charging as the reference, and the ordinate represents the increase amount of the Warburg impedance (the sum of the Warburg impedances of the positive electrode and the negative electrode) from the start of charging. Also, in FIG. 1, the time change of the increase amount of the Warburg impedance in a case where charging is performed at a charging rate $\eta\mathbf{1}$ is indicated by a solid line, and the time change of the increase amount of the Warburg impedance in a case where charging is performed at a charging rate $\eta\mathbf{2}$ higher than the charging rate $\eta\mathbf{1}$ is indicated by a broken line. In the example shown in FIG. 1, conditions other than the charging rates, including the SOC values of the battery at the start and the end of charging, are identical to each other in the charging at the charging rates $\eta\mathbf{1}$ and $\eta\mathbf{2}$. The charging rate $\eta\mathbf{1}$ is a low charging rate and is, for example, 1C. The charging rate $\eta\mathbf{2}$ is a high charging rate and is, for example, 3C.

In low-speed charging at the charging rate $\eta\mathbf{1}$, uneven distribution of lithium does not occur in each of positive electrode and the negative electrode. For this reason, even if the battery is charged, the Warburg impedance hardly increases from the start of charging to the end of charging. On the other hand, in rapid charging at the charging rate $\eta\mathbf{2}$, uneven distribution of lithium occurs in at least one of the positive electrode and the negative electrode. For this reason, if the battery is charged, the Warburg impedance increases along with the elapse of time, and at the end of charging, the Warburg impedance greatly increases from the start of charging. Hence, in rapid charging at the charging rate $\eta\mathbf{2}$, the impedance of the battery is affected by the uneven distribution of lithium in at least one of the positive electrode and the negative electrode.

Also, in the embodiment, concerning the battery as the diagnosis target and the charging target, the impedance of the battery at each of a plurality of frequencies is measured, and the frequency characteristic of the impedance of the battery is measured. The measurement of the frequency characteristic of the impedance of the battery is performed concurrently with charging of the battery. For example, a superimposed current obtained by superimposing a periodically changing current waveform (the current waveform of an AC current) on a charging current at each of a plurality of frequencies is input to the battery, thereby measuring the impedance of the battery at each of the plurality of frequencies.

The measurement result for the frequency characteristic of the impedance of the battery can be shown on, for example, a complex impedance plot (Cole-Cole plot) for the battery. On the complex impedance plot, a real number component and an imaginary number component are shown concerning the impedance of the battery measured at each of a plurality of frequencies. Also, on the complex impedance plot, the distance from the origin indicates the magnitude of the impedance (the absolute value of the impedance). Note that the method of measuring the frequency characteristic of the impedance of the battery by inputting, to the battery, the current waveform with a periodically changing current value and the complex impedance plot are shown in reference literature 1 (Jpn. Pat. Appln. KOKAI Publication No. 2017-106889), or the like.

Figure 2:
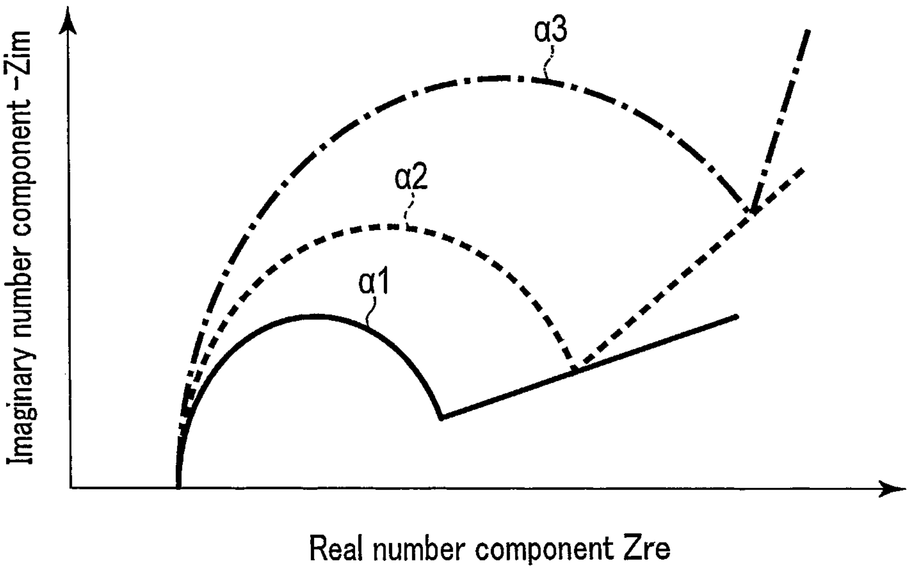
FIG. 2 is a schematic view showing, concerning the battery as the diagnosis target in the embodiment, an example of the frequency characteristic of an impedance as a complex impedance plot.

FIG. 2 is a schematic view showing, concerning the battery as the diagnosis target in the embodiment, an example of the frequency characteristic of the impedance as a complex impedance plot. In FIG. 2, the abscissa represents a real number component Zre of the impedance, and the ordinate represents an imaginary number component −Zim of the impedance. FIG. 2 shows the frequency characteristic of the impedance in each of three states $\alpha 1$ to $\alpha 3$ for the battery. The frequency characteristic of the impedance in the state $\alpha 1$ is indicated by a solid line, the frequency characteristic of the impedance in the state $\alpha 2$ is indicated by a broken line, and the frequency characteristic of the impedance in the state $\alpha 3$ is indicated by an alternate long and short dash line.

The state $\alpha 1$ corresponds to a state immediately after the start of use of the battery, in which uneven distribution of lithium does not occur in each of the positive electrode and the negative electrode. The state $\alpha 2$ corresponds to a state after the elapse of a certain period from the start of use of the battery, in which uneven distribution of lithium does not occur in each of the positive electrode and the negative electrode. The state $\alpha 3$ corresponds to a state in which uneven distribution of lithium occurs in at least one of the positive electrode and the negative electrode due to rapid charging or the like in the same period as the state $\alpha 2$. In each of the states $\alpha 2$ and $\alpha 3$, the period is the period after the state $\alpha 1$. For this reason, the battery is degraded in each of the states $\alpha 2$ and $\alpha 3$ due to the degradation of the electrode active material and coat formation on the positive electrode or the negative electrode, as compared to the state $\alpha 1$. Note that other conditions such as the temperature and the SOC are identical to each other in the states $\alpha 1$ to $\alpha 3$.

As shown in FIG. 2, in the battery as the diagnosis target, if a certain period elapses from the start of use, the frequency characteristic of the impedance of the battery changes due to the degradation of the battery including the degradation of the electrode active material. In the example shown in FIG. 2, the frequency characteristic of the impedance in the state $\alpha 1$ changes to the frequency characteristic of the impedance in the state $\alpha 2$ due to the degradation of the battery.

Also, in the battery as the diagnosis target, even if the degradation state of the battery, and the like are the same, the frequency characteristic of the impedance changes due to the occurrence of uneven distribution of lithium in at least one of the positive electrode and the negative electrode. In the example shown in FIG. 2, the frequency characteristic of the impedance in the state $\alpha 2$ changes to the frequency characteristic of the impedance in the state $\alpha 3$ due to uneven distribution of lithium in at least one of the positive electrode and the negative electrode. In particular, if uneven distribution of lithium occurs in at least one of the positive electrode and the negative electrode, the impedance in the low frequency range, that is, the impedance in the frequency range corresponding to the Warburg impedance largely increases as compared to a state in which lithium is not unevenly distributed in each of the positive electrode and the negative electrode.

Figure 3:
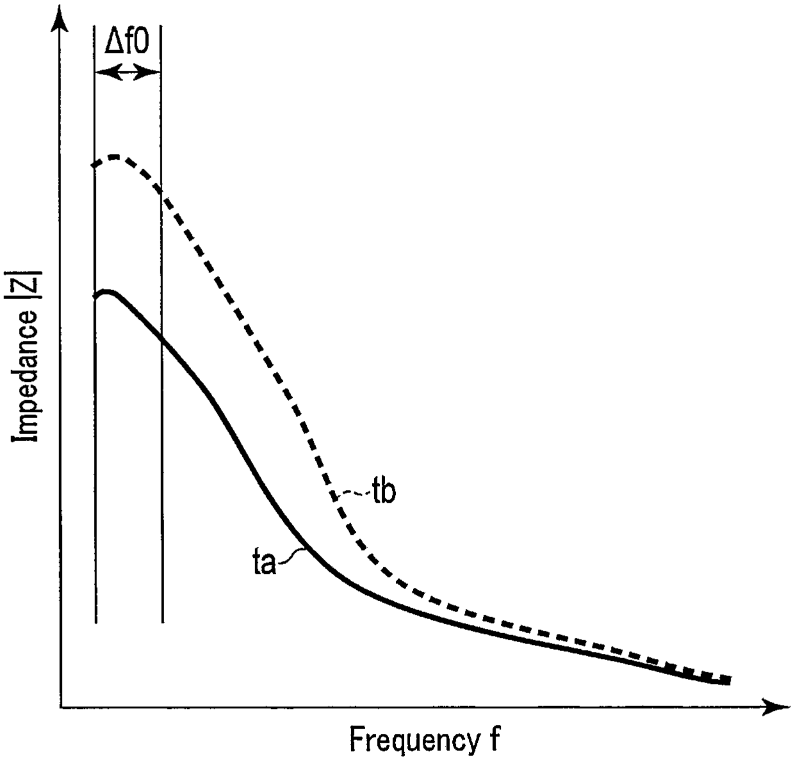
FIG. 3 is a schematic view showing, concerning the battery as the diagnosis target in the embodiment, an example of the change of the frequency characteristic of the impedance caused by charging at a high charging rate.

FIG. 3 is a schematic view showing, concerning the battery as the diagnosis target in the embodiment, an example of the change of the frequency characteristic of the impedance caused by charging at a high charging rate. In FIG. 3, the abscissa represents a frequency f, and the ordinate represents the impedance of the battery as an absolute value |Z|. Also, in FIG. 3, the frequency characteristic of the impedance at time ta at the start of charging or immediately after the start is indicated by a solid line, and the frequency characteristic of the impedance at time tb after the time ta is indicated by a broken line. As shown in FIG. 3, if a certain time elapses from the start of rapid charging at a high charging rate, uneven distribution of lithium occurs in at least one of the positive electrode and the negative electrode, and the frequency characteristic of the impedance of the battery changes. In the example shown in FIG. 3, the frequency characteristic of the impedance at the time ta changes to the frequency characteristic of the impedance at the time tb due to rapid charging.

If the frequency characteristic of the impedance changes as described above, the impedance of the battery largely increases in a low frequency range as compared to the start of charging and the time point immediately after the start. In the example shown in FIG. 3, since uneven distribution of lithium occurs in at least one of the positive electrode and the negative electrode due to rapid charging, the increase of the impedance of the battery is conspicuous at least within a frequency range $\Delta f0$. The frequency range $\Delta f0$ in which the increase of the impedance from the start of charging is conspicuous includes a frequency range corresponding to the Warburg impedance. In an example, a frequency range of 0.005 Hz (inclusive) to 10 Hz (inclusive) corresponds to the frequency range $\Delta f0$.

A diagnosis system that diagnoses a battery as described above will be described below. In the diagnosis system according to the embodiment, the frequency characteristic of the impedance of the battery is measured concurrently with charging of the battery. Then, based on the measurement result for the frequency characteristic of the impedance of the battery, the degradation state of the battery is determined, and the battery is diagnosed. In the determination of the degradation state of the battery, for example, based on the measurement result of the frequency characteristic of the impedance, the impedance component of the battery such as the Warburg impedance of each of the positive electrode and the negative electrode is calculated. Then, based on the calculation result of the impedance component, the degradation state of the battery is determined.

Figure 4:
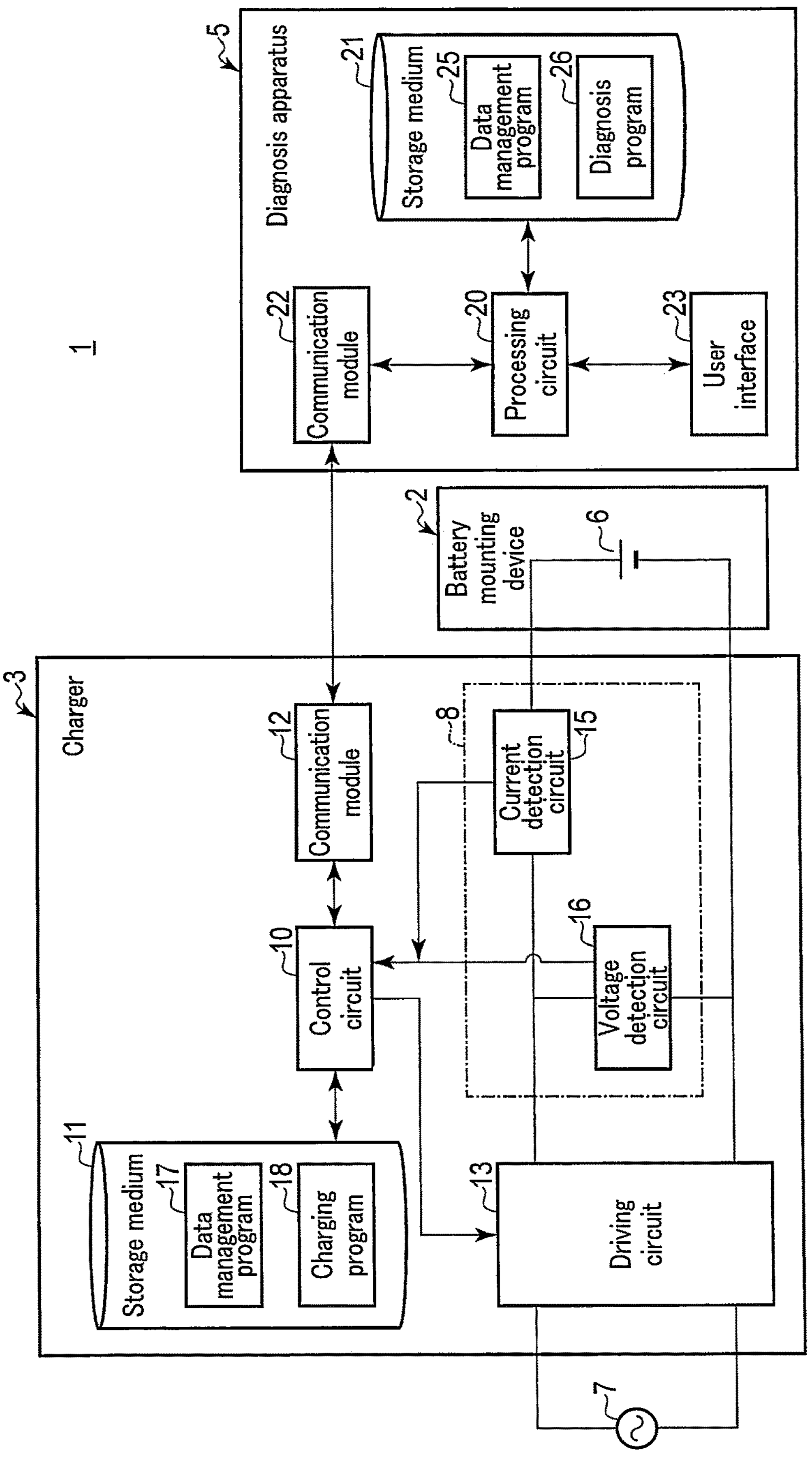
FIG. 4 is a schematic view showing an example of a diagnosis system for a battery according to the embodiment.

FIG. 4 is a schematic view showing an example of a diagnosis system 1 for a battery 6 according to the embodiment. As shown in FIG. 4, the diagnosis system 1 includes a battery mounting device 2, a charger 3, and a diagnosis apparatus 5. The battery 6 is mounted in the battery mounting device 2. Examples of the battery mounting device 2 are a large power storage apparatus for an electric power system, a smartphone, a vehicle, a stationary power supply device, a robot, and a drone, and examples of a vehicle serving as the battery mounting device 2 are a railroad vehicle, an electric bus, an electric car, a plug-in hybrid car, and an electric motorcycle. In the battery 6, if uneven distribution of lithium occurs in at least one of the positive electrode and the negative electrode due to rapid charging, the impedance of the battery in a low frequency range exhibits a tendency of largely increasing.

The charger 3 supplies electric power to the battery 6 in charging of the battery 6. Hence, in charging of the battery 6, a charging current is input from the charger 3 to the battery 6. A control circuit 10, a storage medium (non-transitory storage medium) 11, and a communication module 12 are mounted in the charger 3. Also, in the example shown in FIG. 4, a driving circuit 13, a current detection circuit 15, and a voltage detection circuit 16 are mounted in the charger 3. In charging of the battery 6, the control circuit 10 controls supply of electric power to the battery 6 and controls charging of the battery 6. The control circuit 10 is formed by a processor or an integrated circuit. The processor or the like forming the control circuit 10 includes one of a CPU (Central Processing Unit), an ASIC (Application Specific Integrated Circuit), a microcomputer, an FPGA (Field Programmable Gate Array), and a DSP (Digital Signal Processor). The control circuit 10 may be formed by one processor or the like, or may be formed by a plurality of processors or the like.

The storage medium 11 is one of a main storage device such as a memory and an auxiliary storage device. As the storage medium 11, a magnetic disk, an optical disk (for example, a CD-ROM, a CD-R, or a DVD), a magnetooptical disk (for example, an MO), or a semiconductor memory can be used. The charger 3 may include only one memory serving as the storage medium 11, or may include a plurality of memories. In the charger 3, the control circuit 10, the storage medium 11, and the like form a processing apparatus such as a computer. The communication module 12 is formed by the communication interface of the charger 3. The control circuit 10 communicates with processing apparatuses outside the charger 3, including the diagnosis apparatus 5, via the communication module 12.

The control circuit 10 performs processing by executing programs and the like stored in the storage medium 11. In the example shown in FIG. 4, as the programs to be executed by the control circuit 10, a data management program 17 and a charging program 18 are stored in the storage medium 11. The control circuit 10 executes the data management program 17, thereby performing data write to the storage medium 11 and data read from the storage medium 11. Also, the control circuit 10 executes the charging program 18, thereby performing processing (to be described later) in charging of the battery 6. Note that the program to be executed by the control circuit 10, including the data management program 17 and the charging program 18, may be stored in a computer (server) connected via a network such as the Internet or a server in a cloud environment. In this case, the control circuit 10 downloads the programs via the network. Also, the control circuit 10 performs processing based on an instruction received from the outside via the communication module 12.

In a state in which the battery 6 is being charged by the charger 3, the control circuit 10 controls driving of the driving circuit 13, thereby controlling currents input to the battery 6, including the charging current to the battery 6. In the example shown in FIG. 4, AC electric power from a commercial electric power supply 7 is input to the driving circuit 13 of the charger 3. In the driving circuit 13, for example, an AC/DC converter, a transformation circuit, and the like are mounted. In the driving circuit 13, the AC/DC converter converts the AC electric power from the commercial electric power supply 7 into DC electric power, and the transformation circuit transforms the voltage of the electric power supplied from the commercial electric power supply 7 into a voltage corresponding to the battery 6. Thus, the DC electric power is supplied to the battery 6 with the voltage corresponding to the battery 6, and the charging current is input to the battery 6.

Also, the driving circuit 13 is provided with a current value adjustment circuit configured to adjust the current value of the charging current to the battery 6. The control circuit 10 controls driving of the current value adjustment circuit, thereby adjusting the current value of the charging current. Thus, adjustment for increasing or decreasing the current value of the charging current to the battery 6 and adjustment for maintaining the current value of the charging current to the battery 6 are performed by the control circuit 10. The driving circuit 13 is also provided with a current waveform generation circuit. The current waveform generation circuit generates the periodically changing current waveform of an AC current. The control circuit 10 controls driving of the current waveform generation circuit, thereby adjusting the frequency of the current waveform to be generated.

Additionally, the driving circuit 13 can input, to the battery 6, a superimposed current obtained by superimposing the current waveform generated by the current waveform generation circuit on the charging current of the battery 6. The current value of the superimposed current periodically changes at the frequency of the superimposed current waveform with the current value of the charging current being as the center. The superimposed current is a DC current whose flowing direction does not change. The control circuit 10 controls driving of the driving circuit 13, thereby switching between a state in which the charging current without superimposition of the current waveform is input to the battery 6 and a state in which the superimposed current obtained by superimposing the periodically changing current waveform on the charging current is input to the battery 6.

The current detection circuit 15 and the voltage detection circuit 16 form a measurement unit 8 that detects and measures parameters associated with the battery 6. In a state in which the battery 6 is charged, the measurement unit 8 periodically measures the parameters associated with the battery 6. In the measurement unit 8, as the parameters associated with the battery 6, the current detection circuit 15 periodically detects and measures a current flowing to the battery 6, and the voltage detection circuit 16 periodically detects and measures a voltage applied to the battery 6. In an example, the measurement unit 8 includes a temperature sensor (not shown) in addition to the current detection circuit 15 and the voltage detection circuit 16. In this case, as a parameter associated with the battery 6, the temperature sensor periodically detects and measures the temperature of the battery 6.

In a state in which the battery 6 is being charged by the charger 3, by a signal or the like from the measurement unit 8, the control circuit 10 acquires measurement data including the measurement results, by the measurement unit 8, of the above-described parameters associated with the battery 6. Concerning each of the parameters associated with the battery 6, including the current and the voltage of the battery 6, the control circuit 10 acquires, as measurement data, a measurement value at each of a plurality of measurement time points and a time change (time history). Hence, the control circuit 10 may acquire the time change (time history) of the current of the battery 6 and the time change (time history) of the voltage of the battery 6. In an example, the control circuit 10 may acquire the time change (time history) of the temperature of the battery 6. Based on the measurement data for the parameters associated with the battery 6, the control circuit 10 controls the driving circuit 13, thereby controlling the current input to the battery 6.

Note that in the example shown in FIG. 4, the measurement unit 8 is provided in the charger 3. However, the measurement unit 8 including the current detection circuit 15 and the voltage detection circuit 16 may be provided in the battery mounting device 2. In addition, the battery mounting device 2 may have a charging function of charging the battery, like the charger 3. In this case, processing (to be described later) by the control circuit 10 of the charger 3 is performed by the processor or integrated circuit of the battery mounting device 2.

In the embodiment, when charging the battery 6, the control circuit 10 performs the following processing by executing the charging program 18. That is, the control circuit 10 controls driving of the driving circuit 13, thereby inputting the charging current to the battery 6 to start charging of the battery 6. Then, at the first time point that is the start of charging or a time point immediately after the start of charging, the control circuit 10 measures the impedance of the battery 6 at a predetermined frequency F0. The impedance of the battery 6 at the predetermined frequency F0, which is measured at the first time point, will be referred to as the "first impedance" in the following explanation.

Figure 5:
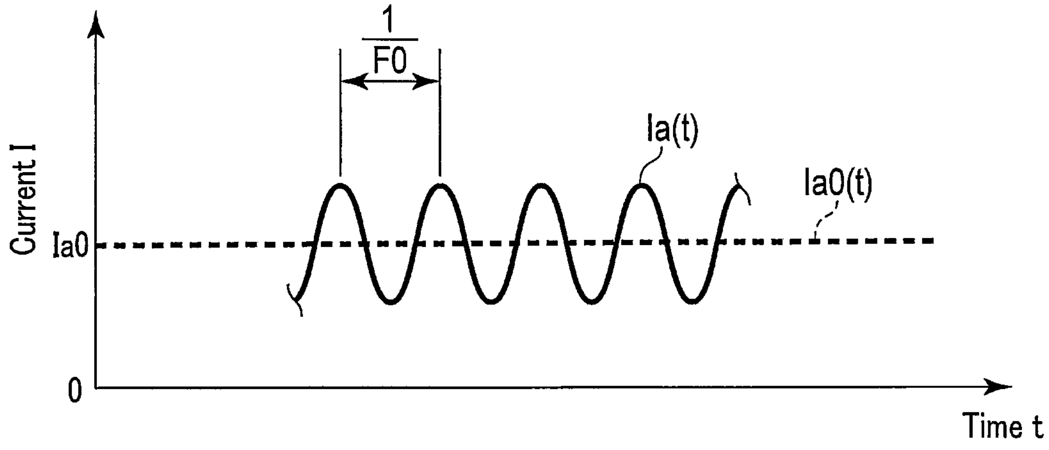
FIG. 5 is a schematic view showing an example of a current waveform input to the battery in measurement of the first impedance of the battery according to the embodiment.

FIG. 5 is a schematic view showing an example of a current waveform input to the battery 6 in measurement of the first impedance of the battery 6 according to the embodiment. In FIG. 5, the abscissa represents time t, and the ordinate represents a current I. In the example shown in FIG. 5, the driving circuit 13 generates a superimposed current Ia(t) by superimposing the current waveform of an AC current that periodically changes at the predetermined frequency F0 on a charging current Ia0(*t*), and inputs the generated superimposed current Ia(t) to the battery 6. In the superimposed current Ia(t) input to the battery 6, the current value periodically changes with the current value Ia0 of the charging current being as the center. The superimposed current Ia(t) is a DC current whose flowing direction does not change. By inputting the superimposed current Ia(t) of the example shown in FIG. 5 to the battery 6, the first impedance is measured concurrently with charging of the battery 6.

In addition, the superimposed current Ia(t) input to the battery 6 in the measurement of the first impedance periodically changes at the predetermined frequency F0. For this reason, one period of the superimposed current Ia(t) is the reciprocal (1/F0) of the predetermined frequency F0. Note that the current waveform of the superimposed current Ia(t) shown in FIG. 5 is a sinusoidal wave (sin wave). However, the current waveform of the superimposed current input to the battery 6 may be a current waveform such as a triangular wave or a sawtooth wave other than the sinusoidal wave.

In the measurement unit 8, the current detection circuit 15 and the voltage detection circuit 16 measure the current and the voltage of the battery 6, respectively, in a state in which the superimposed current whose current value periodically changes at the predetermined frequency F0, as described above, is input to the battery 6. Then, the control circuit 10 acquires measurement data representing the measurement results of the current and the voltage of the battery 6 in the state in which the superimposed current at the predetermined frequency F0 is input to the battery 6. Based on the measurement data in the state in which the superimposed current at the predetermined frequency F0 is input to the battery 6, the control circuit 10 calculates the first impedance as the impedance of the battery 6 at the predetermined frequency F0 at the first time point.

In an example, the control circuit 10 calculates a peak-to-peak value (variation width) in the periodical change of the current of the battery 6 based on the time change of the current of the battery 6, and calculates a peak-to-peak value (variation width) in the periodical change of the voltage of the battery 6 based on the time change of the voltage of the battery 6. A processing circuit 20 then calculates the first impedance of the battery 6 from the ratio of the peak-to-peak value of the voltage to the peak-to-peak value of the current.

Here, the first time point is the start of charging of the battery 6 or a time point immediately after the start, as described above. The first time point is a time point before a time point at which 10 sec is elapsed from the start of charging of the battery. The predetermined frequency F0 is a relatively low frequency and is a frequency within the frequency range corresponding to the Warburg impedance. Hence, the predetermined frequency F0 is included in the frequency range in which the increase of the impedance of the battery 6 is conspicuous due to uneven distribution of lithium in at least one of the positive electrode and the negative electrode. For this reason, in an example, the predetermined frequency F0 is 10 Hz or less.

When measuring the first impedance by inputting the superimposed current, it is necessary to suppress a change of the state of the battery 6 such as the SOC of the battery 6 during the measurement of the first impedance. From this viewpoint, the period of the superimposed current needs to be made short to such an extent that the state of the battery 6 does not change during the measurement of the first impedance. For this reason, in an example, the predetermined frequency F0 is 0.005 Hz or more. Hence, the predetermined frequency F0 that is the frequency of the superimposed current is preferably a frequency within the frequency range of 0.005 Hz (inclusive) to 10 Hz (inclusive).

When the first impedance of the battery 6 is measured in the above-described way, the control circuit 10 measures the impedance of the battery 6 at the predetermined frequency F0 at a second time point after a time point at which a predetermined time is elapsed from the first time point. The impedance of the battery 6 at the predetermined frequency F0, which is measured at the second time point, will be referred to as the "second impedance" in the following explanation. In measurement of the second impedance as well, the control circuit 10 controls driving of the driving circuit 13, thereby inputting a superimposed current generated by superimposing an AC current that periodically changes at the predetermined frequency F0 on the charging current, like the measurement of the first impedance. For example, the superimposed current Ia(t) shown in FIG. 5 is input to the battery 6.

Also, like the measurement of the first impedance, based on the measurement data in the state in which the superimposed current at the predetermined frequency F0 is input to the battery 6, the control circuit 10 calculates the second impedance as the impedance of the battery 6 at the predetermined frequency F0 at the second time point. Note that the above-described predetermined time from the first time point is preferably a time of 10 sec (inclusive) to 360 sec (inclusive). Also, during the time after the measurement of the first impedance to the measurement of the second impedance, the charging current is continuously input to the battery 6, and the battery is continuously charged. Between the first time point and the second time point, the charging current without superimposition of the AC current may be input to the battery 6, or the superimposed current obtained by superimposing the AC current on the charging current may be input to the battery 6.

When the first impedance at the first time point and the second impedance at the second time point are measured in the above-described way, the control circuit 10 executes the charging program 18, thereby calculating a parameter representing the increase state of the second impedance to the first impedance as an index. In an example, one of an increase ratio $\beta$ of the second impedance to the first impedance and the increase amount of the second impedance to the first impedance is calculated as the index.

The increase ratio β is calculated by equation (1) using a first impedance Z1 and a second impedance Z2. The increase amount corresponds to a value obtained by subtracting the first impedance (the absolute value of the first impedance) from the second impedance (the absolute value of the second impedance). The parameter representing the increase state of the second impedance to the first impedance, such as the increase ratio β, has a negative value if the second impedance decreases relative to the first impedance.

$$\beta=(|Z2|-|Z1|)/|Z1| \quad (1)$$

Based on the calculation result of the parameter serving as the index such as the increase ratio β, the control circuit 10 adjusts the current value of the charging current. That is, using the parameter representing the increase state of the second impedance to the first impedance as the index, the current value of the charging current is adjusted. At this time, for the parameter serving as the index, a reference range from a lower limit value (inclusive) to an upper limit value (inclusive) is defined. In an example, the increase ratio β of the second impedance to the first impedance is calculated as the index, and a reference range from a lower limit value β1 (inclusive) to an upper limit value βu (inclusive) is defined for the increase ratio β.

Based on whether the parameter serving as the index falls within the above-described reference range or not, the control circuit 10 adjusts the current value of the charging current. If the parameter serving as the index falls within the reference range, the control circuit 10 maintains the current value of the charging current. If the parameter serving as the index is larger than the upper limit value of the reference range, the control circuit 10 decreases the current value of the charging current. If the parameter serving as the index is smaller than the lower limit value of the reference range, the control circuit 10 increases the current value of the charging current. In an example, the above-described increase ratio β is calculated as the index. If the increase ratio β fall within the range of the lower limit value β1 (inclusive) to the upper limit value βu (inclusive), the] current value of the charging current is maintained. If the increase ratio β is smaller than the lower limit value β1, the current value of the charging current is increased. If the increase ratio β is larger than the upper limit value βu, the current value of the charging current is decreased.

After the second time point, the control circuit 10 inputs the charging current to the battery 6 with the current value adjusted as described above based on the parameter such as the increase ratio β representing the increase state of the second impedance to the first impedance. Until an end condition to end the charging is satisfied, the control circuit 10 continues the charging of the battery 6.

In an example, at a third time point after the second time point, the control circuit 10 measures the impedance of the battery 6 at the predetermined frequency F0. The impedance of the battery 6 at the predetermined frequency F0, which is measured at the third time point, will be referred to as the "third impedance" in the following explanation. In measurement of the third impedance, the above-described superimposed current is input to the battery 6, like the measurement of the first impedance and the second impedance. The control circuit 10 then calculates, as an index, a parameter representing the increase state of the third impedance to the first impedance, such as the increase ratio of the third impedance to the first impedance. At this time, the parameter serving as the index is calculated like the calculation of the parameter representing the increase state of the second impedance to the first impedance.

Based on whether the parameter representing the increase state of the third impedance to the first impedance, that is, the parameter calculated as the index falls within the reference range, the control circuit 10 adjusts the current value of the charging current. At this time, the current value of the charging current is adjusted, like the adjustment of the current value of the charging current based on the parameter such as the above-described increase ratio β representing the increase state of the second impedance to the first impedance. After the third time point as well, the control circuit 10 may adjust the current value of the charging current based on the increase state of the impedance of the battery 6 at the predetermined frequency F0 to the first impedance. In this case, the current value of the charging current is adjusted, like the adjustment of the current value of the charging current based on the parameter such as the above-described increase ratio β representing the increase state of the second impedance to the first impedance.

For the battery 6 as the diagnosis target, the diagnosis apparatus 5 diagnoses the state of the battery 6, including the degradation state of the battery 6. In the example shown in FIG. 4 or the like, the diagnosis apparatus 5 is a processing apparatus (computer) such as a server provided outside the battery mounting device 2 and the charger 3, and can communicate with the charger 3 via a network. The diagnosis apparatus 5 includes the processing circuit 20, a storage medium (non-transitory storage medium) 21, a communication module 22, and a user interface 23. The processing circuit 20 is formed by a processor or an integrated circuit. The processor or the like forming the processing circuit 20 includes one of a CPU, an ASIC, a microcomputer, an FPGA, and a DSP. The processing circuit 20 may be formed by one processor or the like, or may be formed by a plurality of processors or the like. The storage medium 21 is one of a main storage device such as a memory and an auxiliary storage device. The diagnosis apparatus 5 may include only one memory serving as the storage medium 21, or may include a plurality of memories.

The processing circuit 20 performs processing by executing programs and the like stored in the storage medium 21. In the example shown in FIG. 4, as the programs to be executed by the processing circuit 20, a data management program 25 and a diagnosis program 26 are stored in the storage medium 21. The processing circuit 20 executes the data management program 25, thereby performing data write to the storage medium 21 and data read from the storage medium 21. Also, the processing circuit 20 executes the diagnosis program 26, thereby performing processing (to be described later) in diagnosis of the battery 6.

Note that in an example, the diagnosis apparatus 5 is formed by a plurality of processing apparatuses (computers) such as a plurality of servers, and the processors of the plurality of processing apparatuses cooperatively perform processing (to be described later) in the diagnosis of the battery 6. In another example, the diagnosis apparatus 5 is formed by a cloud server in a cloud environment. The infrastructure of the cloud environment is formed by a virtual processor such as a virtual CPU and a cloud memory. Hence, if the diagnosis apparatus 5 is formed by a cloud server, on behalf of the processing circuit 20, the virtual processor performs processing (to be described later) in the diagnosis of the battery 6. The cloud memory has a function of storing programs and data, like the storage medium 21.

In an example, the storage medium 21 that stores the programs to be executed by the processing circuit 20 and data to be used for the processing of the processing circuit 20 is provided in a computer separate from the charger 3 and the diagnosis apparatus 5. In this case, the diagnosis apparatus 5 is connected, via a network, to the computer in which the storage medium 21 and the like are provided. In another example, the diagnosis apparatus 5 is mounted in the battery mounting device 2 or the charger 3. In this case, in the diagnosis apparatus 5, on behalf of the processing circuit 20, a processor or the like mounted in the battery mounting device 2 or the charger 3 performs processing (to be described later) in the diagnosis of the battery 6.

The communication module 22 is formed by the communication interface of the processing apparatus that forms the diagnosis apparatus 5. The processing circuit 20 communicates with devices outside the diagnosis apparatus 5, including the charger 3, via the communication module 22. On the user interface 23, the user of the diagnosis apparatus 5 and the diagnosis system 1, or the like inputs an operation associated with the diagnosis of the battery 6. Hence, the user interface 23 is provided with buttons, a mouse, a touch panel, or a keyboard serving as an operation unit used by the user to input an operation. Also, the user interface 23 is provided with a notification unit that notifies information associated with the diagnosis of the battery 6. The notification unit notifies the information by screen display or sound generation. Note that the user interface 23 may be provided separately from the processing apparatus that forms the diagnosis apparatus 5.

The processing circuit 20 executes the diagnosis program 26, thereby diagnosing the battery 6 as the diagnosis target. In the diagnosis of the battery 6, in a state in which the battery 6 is being charged by the charging current whose current value is adjusted by the control circuit 10 in the above-described way, the processing circuit 20 measures the frequency characteristic of the impedance of the battery 6. At this time, the processing circuit 20 transmits an instruction to the charger 3 via the communication module 22, and the control circuit 10 receives the instruction from the diagnosis apparatus 5 via the communication module 12. The control circuit 10 then superimposes the periodically changing current waveform of the AC current on the charging current with the adjusted current value at each of a plurality of frequencies, and sequentially inputs the superimposed currents at the plurality of frequencies to the battery 6.

In a state in which the superimposed current is input at each of the plurality of frequencies, the control circuit 10 measures each of the current and the voltage of the battery 6 and transmits measurement data representing the measurement results to the diagnosis apparatus 5 via the communication module 12. The processing circuit 20 calculates the impedance at each of the plurality of frequencies based on the measurement data received from the charger 3 via the communication module 22. At this time, the impedance is calculated, like the first impedance, the second impedance, and the like. The processing circuit 20 calculates the impedance of the battery 6 at each of the plurality of frequencies, thereby calculating the frequency characteristic of the impedance of the battery 6.

In an example, in a state in which charging is performed with a current value for which the parameter such as the increase ratio β representing the increase state of the second impedance to the first impedance falls within the reference range, the current waveform of the AC current is superimposed on the charging current, and the frequency characteristic of the impedance of the battery 6 is measured in the above-described way. For example, after the control circuit 10 maintains the current value of the charging current based on the fact that the index such as the increase ratio β falls within the reference range, in a state in which the battery 6 is being charged by the charging current of the maintained current value, the processing circuit 20 sequentially superimposes the current waveform on the charging current at each of the plurality of frequencies, and measures the frequency characteristic of the impedance of the battery 6.

Also, the processing circuit 20 executes the diagnosis program 26, thereby determining the degradation state of the battery 6 based on the measurement result of the frequency characteristic of the impedance of the battery 6. At this time, based on the measurement result of the frequency characteristic of the impedance, the impedance component of the battery 6 including the Warburg impedance of each of the positive electrode and the negative electrode is calculated. In an example, as the impedance component of the battery 6, an ohmic resistance and the charge transfer resistance of each of the positive electrode and the negative electrode are calculated.

The storage medium 21 stores an equivalent circuit model including information about the equivalent circuit of the battery 6. In the equivalent circuit of the equivalent circuit model, a plurality of electric characteristic parameters (circuit constants) corresponding to the impedance components of the battery 6 are set. The electric characteristic parameters are parameters representing the electric characteristics of circuit elements provided in the equivalent circuit. Examples of the electric characteristic parameters are a resistance, a capacitance (capacity), an inductance, and an impedance. Resistances shown as electric characteristic parameters in the equivalent circuit can include, for example, an ohmic resistance and the charge transfer resistance of each of the positive electrode and the negative electrode. Also, the electric characteristic parameters set in the equivalent circuit can include the Warburg impedance of each of the positive electrode and the negative electrode.

Also, the equivalent circuit model stored in the storage medium 21 includes data representing the relationship between the electric characteristic parameters of the equivalent circuit and the impedance of the battery 6. The data representing the relationship between the electric characteristic parameters and the impedance of the battery 6 shows, for example, expressions for calculating the real number component and the imaginary number component of the impedance from the electric characteristic parameters (circuit constants). In this case, in the expressions, each of the real number component and the imaginary number component of the impedance of the battery 6 is calculated using the electric characteristic parameters, the frequency, and the like.

The processing circuit 20 performs a fitting calculation using the equivalent circuit model including the above-described equivalent circuit, and the measurement result for the frequency characteristic of the impedance of the battery 6. At this time, the fitting calculation is performed using the electric characteristic parameters of the equivalent circuit including the resistance components of the battery 6 as variables, thereby calculating the electric characteristic parameters as the variables. Also, in the fitting calculation, for example, at each of the frequencies at which the impedance is measured, the values of the electric characteristic parameters as the variables are decided such that the difference between the calculation result of the impedance using the expression included in the equivalent circuit model and the measurement result of the impedance becomes as small as possible.

When the fitting calculation is performed as described above, an impedance component such as a resistance component set as one of the electric characteristic parameters in the equivalent circuit is calculated. Note that the equivalent circuit of the battery is shown in reference literature 1. Reference literature 1 also shows a method of performing a fitting calculation using the measurement result for the frequency characteristic of the impedance of the battery and the equivalent circuit model of the battery and calculating the electric characteristic parameters (circuit constants) of the equivalent circuit.

The processing circuit 20 determines the degradation state of the battery 6 based on the calculation results of the resistance components by the fitting calculation. In an example, the processing circuit 20 calculates the charge transfer resistance of each of the positive electrode and the negative electrode based on the measurement result for the frequency characteristic of the impedance of the battery 6. The processing circuit 20 determines the degree of degradation of the positive electrode based on the degree of the change of the charge transfer resistance of the positive electrode from the start of use of the battery 6, and determines the degree of degradation of the negative electrode based on the degree of the change of the charge transfer resistance of the negative electrode from the start of use of the battery 6.

Figure 6:
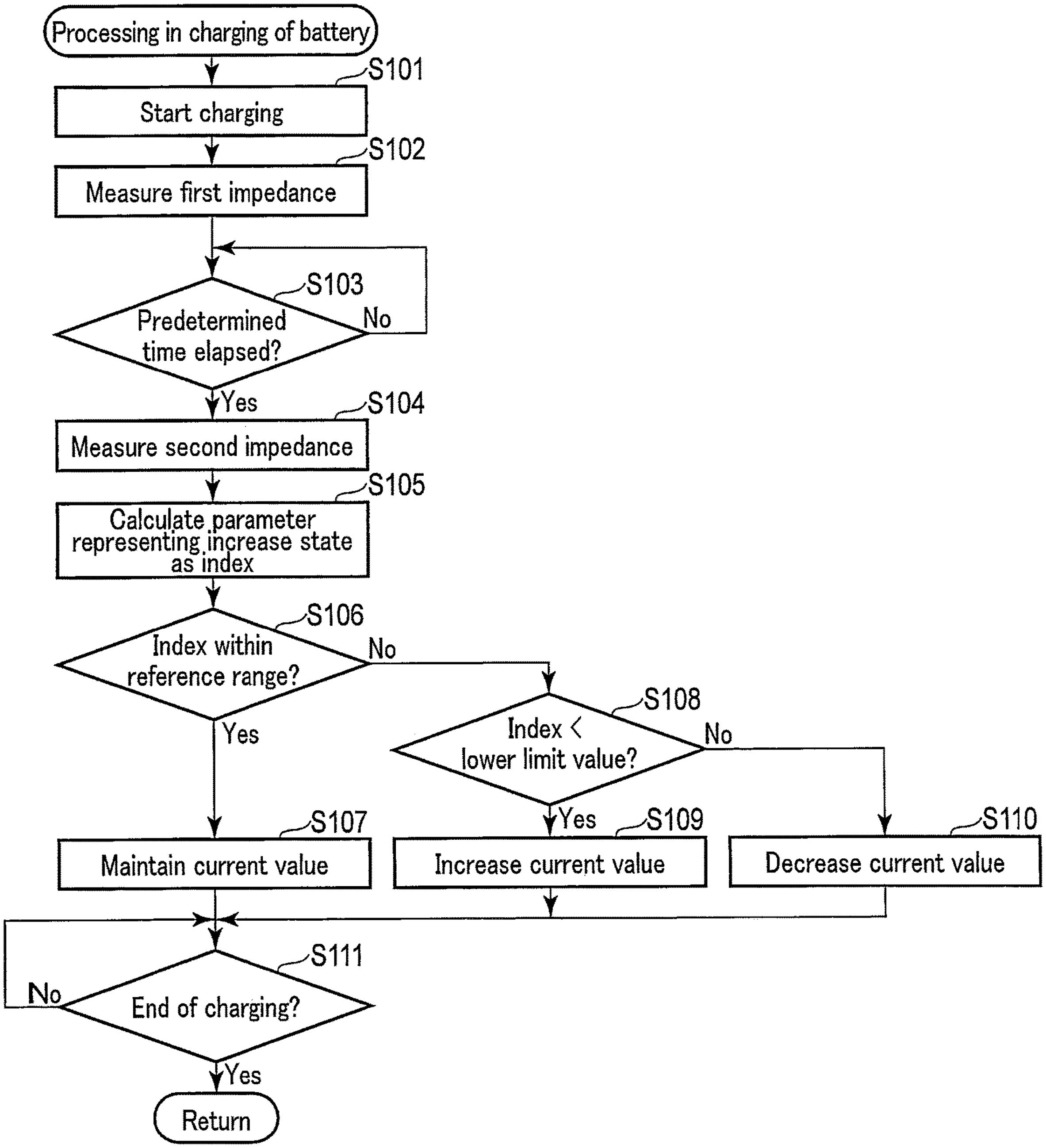
FIG. 6 is a flowchart schematically showing an example of processing performed by the control circuit of a charger executing a charging program in the embodiment.

FIG. 6 is a flowchart schematically showing an example of processing performed by the control circuit 10 of the charger 3 executing the charging program 18 in the embodiment. FIG. 6 shows processing in charging of the battery 6, and the processing shown in FIG. 6 is performed every time the battery 6 is charged once. When the processing shown in FIG. 6 is started, the control circuit 10 inputs the charging current to the battery 6 to start charging of the battery 6 (step S101). Then, at the first time point that is the start of charging of the battery or a time point immediately after the start, the control circuit 10 then measures the impedance of the battery 6 at the predetermined frequency F0. At this time, the control circuit 10 inputs the above-described superimposed current to the battery 6 at the predetermined frequency F0, thereby measuring the first impedance as the impedance of the battery 6 at the predetermined frequency F0 at the first time point (step S102). The control circuit 10 waits until a predetermined time elapses from the first time point (NO in step S103).

If the predetermined time elapses from the first time point (YES in step S103), the control circuit 10 measures the impedance of the battery 6 at the predetermined frequency F0 at the second time point after a time point at which the predetermined time is elapsed from the first time point. At this time, the control circuit 10 inputs the above-described superimposed current to the battery 6 at the predetermined frequency F0, thereby measuring the second impedance as the impedance of the battery 6 at the predetermined frequency F0 at the second time point (step S104). The control circuit 10 calculates a parameter representing the increase state of the second impedance to the first impedance as an index (step S105). At this time, for example, the increase ratio β of the second impedance to the first impedance is calculated The control circuit 10 determines whether the calculated index falls within the reference range from the lower limit value (inclusive) to the upper limit value (inclusive) (step S106). If the index such as the increase ratio β falls within the reference range (YES in step S106), the control circuit 10 maintains the current value of the charging current at the current value in real time (step S107). On the other hand, if the index falls outside the reference range (NO in step S106), the control circuit 10 determines whether the index is smaller than the lower limit value of the reference range (step S108). If the index is smaller than the lower limit value (YES in step S108), the control circuit 10 increases the current value of the charging current from the current value in real time (step S109). On the other hand, if the index is larger than the upper limit value (NO in step S108), the control circuit 10 decreases the current value of the charging current from the current value in real time (step S110).

Unless the end condition of charging is satisfied (NO in step S111), the control circuit 10 continues the charging of the battery 6 with the current value adjusted in one of steps S107, S109, and S110. If the end condition of charging is satisfied (YES in step S111), the control circuit 10 stops input of the charging current to the battery 6 to end the charging.

Note that in an example, even after the second time point, the control circuit 10 measures the impedance of the battery 6 at the predetermined frequency F0. For the impedance of the battery 6 at the predetermined frequency F0, which is measured at the time point after the second time point, the control circuit 10 calculates a parameter representing the increase state to the first impedance at the first time point. The control circuit performs the same processing as in steps S106 to S110 of the example shown in FIG. 6 using the calculated parameter as an index, thereby adjusting the current value of the charging current.

Figure 7:
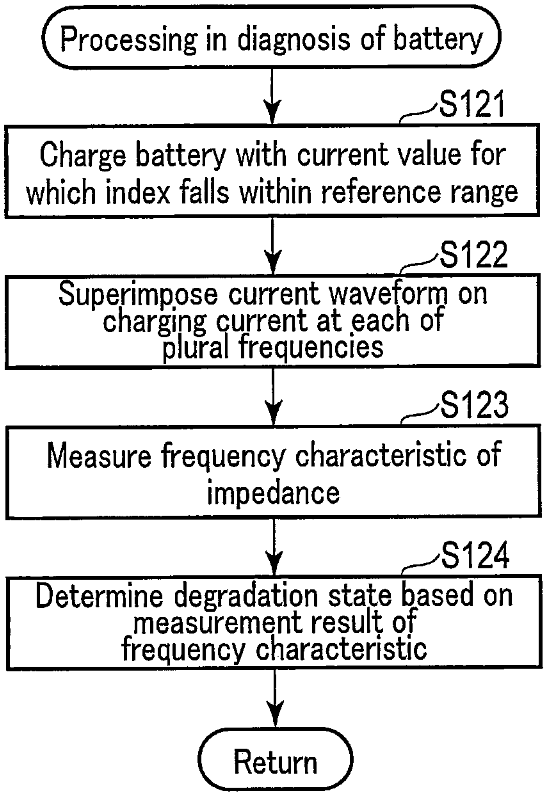
FIG. 7 is a flowchart schematically showing an example of processing performed by the processing circuit of a diagnosis apparatus executing a diagnosis program in the embodiment.

FIG. 7 is a flowchart schematically showing an example of processing performed by the processing circuit 20 of the diagnosis apparatus 5 executing the diagnosis program 26 in the embodiment. FIG. 7 shows processing in diagnosis of the battery 6, and the processing shown in FIG. 7 is performed every time the battery 6 is diagnosed. When the processing shown in FIG. 7 is started, the processing circuit 20 transmits an instruction to the control circuit 10 of the charger 3 to charge the battery 6 with the current value for which the index that is the parameter representing the increase state of the second impedance to the first impedance falls within the reference range (step S121). The processing circuit 20 then transmits an instruction to the control circuit 10 of the charger 3 to superimpose the current waveform of an AC current on the charging current at each of a plurality of frequencies (step S122). Thus, the superimposed currents at the plurality of frequencies are sequentially input to the battery 6.

The processing circuit 20 inputs the superimposed current to the battery 6 at each of the plurality of frequencies, thereby calculating the impedance of the battery 6 at each of the plurality of frequencies and calculating the frequency characteristic of the impedance of the battery 6 (step S123). In an example, after the control circuit 10 maintains the current value of the charging current based on the fact that the index falls within the reference range in step S107 of the example shown in FIG. 6, in a state in which the battery 6 is being charged by the charging current of the maintained current value, the processing circuit 20 sequentially superimposes the current waveform on the charging current at each of the plurality of frequencies, and measures the frequency characteristic of the impedance of the battery 6. The processing circuit 20 then determines the degradation state of the battery 6 in the above-described way based on the measurement result for the frequency characteristic of the impedance (step S124).

As described above, in this embodiment, at each of the first time point and the second time point after a time point at which a predetermined time is elapsed from the first time point, the superimposed current obtained by superimposing the current waveform that periodically changes at the predetermined frequency F0 on the charging current is input to the battery 6. The above-described superimposed current is input to the battery 6, thereby measuring, concerning the impedance of the battery 6 at the predetermined frequency F0, the first impedance at the first time point and the second impedance at the second time point. Using the parameter representing the increase state of the second impedance to the first impedance as the index, the current value of the charging current is adjusted.

Here, in charging at a high charging rate, if a certain time elapses from the start of charging, uneven distribution of lithium occurs in at least one of the positive electrode and the negative electrode, as described above, and the impedance of the battery 6 increases. For this reason, when the current value of the charging current is adjusted using the parameter representing the increase state of the second impedance to the first impedance as the index, the current value of the charging current can be adjusted such that the uneven distribution of lithium does not occur in each of the positive electrode and the negative electrode. In addition, the current value of the charging current can be adjusted such that the current value becomes as large as possible within such a range that uneven distribution of lithium does not occur in each of the positive electrode and the negative electrode.

In this embodiment, since the current value of the charging current is adjusted, as described above, the current value of the charging current can be adjusted to an appropriate magnitude in a case where the impedance of the battery is measured concurrently with charging of the battery. That is, the magnitude of the charging current can be adjusted to such a magnitude that uneven distribution of lithium does not occur in each of the positive electrode and the negative electrode, and an increase in the charging time is suppressed.

Also, in this embodiment, in a state in which the battery 6 is being charged by the charging current whose current value is adjusted to an appropriate magnitude in the above-described way, the periodically changing current waveform is superimposed on the charging current, thereby measuring the frequency characteristic of the impedance of the battery 6. Hence, the frequency characteristic of the impedance of the battery 6 is measured in a state in which uneven distribution of lithium does not occur or hardly occurs in each of the positive electrode and the negative electrode. That is, the measurement result for the frequency characteristic of the impedance of the battery 6 is affected by the degradation of the battery including the degradation of the electrode active material but is hardly affected by the uneven distribution of lithium in each of the positive electrode and the negative electrode. Hence, when the degradation state of the battery 6 is diagnosed based on the measurement result for the frequency characteristic of the impedance of the battery 6, the degradation state of the battery 6 including the degradation state of the electrode active material is more appropriately determined.

Furthermore, in this embodiment, the current value of the charging current is adjusted based on whether the parameter serving as the index such as the increase ratio β falls within the reference range. For example, if the index falls within the reference range, the current value of the charging current is maintained. If the index is smaller than the lower limit value of the reference range, the current value of the charging current is increased. If the index is larger than the upper limit value of the reference range, the current value of the charging current is decreased. Since the current value of the charging current is adjusted as described above, the current value of the charging current is appropriately adjusted such that the current value becomes as large as possible within such a range that uneven distribution of lithium does not occur in each of the positive electrode and the negative electrode.

Also, in this embodiment, using a frequency within the frequency range of 0.005 Hz (inclusive) to 10 Hz (inclusive) as the predetermined frequency F0, the superimposed current is input to the battery 6, and the impedance of the battery 6 at the predetermined frequency F0 is measured. Also, in this embodiment, the first impedance is measured by defining the start of charging of the battery 6 or a time point immediately after the start as the first time point. It is therefore possible to appropriately determine, based on the parameter representing the increase state of the second impedance to the first impedance, whether uneven distribution of lithium occurs in one of the positive electrode and the negative electrode in charging in real time. Hence, the current value of the charging current is appropriately adjusted such that uneven distribution of lithium does not occur in each of the positive electrode and the negative electrode.

In at least one embodiment or example described above, concerning the impedance of the battery at the predetermined frequency, the first impedance at the first time point and the second impedance at the second time point after a time point at which a predetermined time is elapsed from the first time point are measured. Then, the current value of the charging current is adjusted using the parameter representing the increase state of the second impedance to the first impedance as the index. It is therefore possible to provide a charging method, a charger, and a charging program of a battery, which are configured to adjust the current value of a charging current to an appropriate magnitude in a case where the impedance of the battery is measured concurrently with charging of the battery. It is also possible to provide a diagnosis method of a battery, which is executed in a state in which the charging method is executed, a diagnosis system of a battery, which includes the charger, and a diagnosis program to be executed in a state in which the charging program is executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charging method of a battery, comprising:

at each of a first time point and a second time point after a time point at which a predetermined time is elapsed from the first time point, measuring, concerning an impedance of the battery at a predetermined frequency, the predetermined frequency being a frequency within a frequency range corresponding to Warburg impedance and in a range of from 0.005 Hz to less than 10 Hz, a first impedance at the first time point and a second impedance at the second time point by inputting a superimposed current obtained by superimposing a current waveform that periodically changes at the predetermined frequency on a charging current to the battery; and adjusting a current value of the charging current using a parameter representing an increase state of the second impedance to the first impedance as an index.

2. The method according to claim 1, wherein in the measuring each of the first impedance and the second impedance, the superimposed current is input to the battery using a frequency within a frequency range of 0.005 Hz or more to 10 Hz or less as the predetermined frequency.

3. The method according to claim 1, wherein in the adjusting the current value of the charging current, the current value of the charging current is adjusted using, as the index, one of an increase ratio of the second impedance to the first impedance and an increase amount of the second impedance to the first impedance.

4. The method according to claim 1, wherein in the measuring the first impedance, the first impedance is measured by defining one of a start of charging of the battery and a time point within 10 seconds after the start as the first time point.

5. A diagnosis method of a battery, comprising:

in a state in which the battery is charged by a charging current whose current value is adjusted by a charging method according to claim 1, measuring a frequency characteristic of an impedance of the battery by superimposing a periodically changing current waveform on the charging current; and determining a degradation state of the battery based on a measurement result for the frequency characteristic of the impedance of the battery.

6. A charger of a battery, comprising a processor configured to:

at each of a first time point and a second time point after a time point at which a predetermined time is elapsed from the first time point, measure, concerning an impedance of the battery at a predetermined frequency, the predetermined frequency being a frequency within a frequency range corresponding to Warburg impedance and in a range of from 0.005 Hz to less than 10 Hz, a first impedance at the first time point and a second impedance at the second time point by inputting a superimposed current obtained by superimposing a current waveform that periodically changes at the predetermined frequency on a charging current to the battery; and adjust a current value of the charging current using a parameter representing an increase state of the second impedance to the first impedance as an index.

7. The method according to claim 1, wherein in the adjusting the current value of the charging current, the current value is adjusted based on whether the parameter serving as the index falls within a reference range from a lower limit value or more to an upper limit value or less.

8. The method according to claim 7, wherein in the adjusting the current value of the charging current, if the parameter serving as the index falls within the reference range, the current value of the charging current is maintained, if the parameter serving as the index is larger than an upper limit value of the reference range, the current value of the charging current is decreased, and if the parameter serving as the index is smaller than a lower limit value of the reference range, the current value of the charging current is increased.

9. A diagnosis system of a battery, comprising:

a charger according to claim 6;

a battery to which a charging current is supplied by the charger; and a diagnosis apparatus configured to diagnose the battery.

10. The system according to claim 9, wherein in a state in which the battery is charged by the charging current with an adjusted current value, the diagnosis apparatus measures a frequency characteristic of an impedance of the battery by superimposing a periodically changing current waveform on the charging current, and the diagnosis apparatus determines a degradation state of the battery based on a measurement result for the frequency characteristic of the impedance of the battery.

11. A non-transitory storage medium storing a charging program causing a computer to:

at each of a first time point and a second time point at which a predetermined time is elapsed from the first time point, measure, concerning an impedance of a battery at a predetermined frequency, the predetermined frequency being a frequency within a frequency range corresponding to Warburg impedance and in a range of from 0.005 Hz to less than 10 Hz, a first impedance at the first time point and a second impedance at the second time point by inputting a superimposed current obtained by superimposing a current waveform that periodically changes at the predetermined frequency on a charging current to the battery; and adjust a current value of the charging current using a parameter representing an increase state of the second impedance to the first impedance as an index.

12. A non-transitory storage medium storing a diagnosis program causing a computer to:

in a state in which a battery is charged by a charging current whose current value is adjusted by executing the charging program stored in the non-transitory storage medium according to claim 11, measure a frequency characteristic of an impedance of the battery by superimposing a periodically changing current waveform on the charging current; and determine a degradation state of the battery based on a measurement result for the frequency characteristic of the impedance of the battery.

* * * * *